United States Patent
Zang (10) Patent No.: US 9,472,574 B2
(45) Date of Patent: Oct. 18, 2016

(54) ULTRATHIN BODY (UTB) FINFET SEMICONDUCTOR STRUCTURE

(71) Applicant: GLOBALFOUNDRIES Inc., Grand Cayman (KY)

(72) Inventor: Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/609,115

(22) Filed: Jan. 29, 2015

(65) Prior Publication Data

US 2016/0225791 A1    Aug. 4, 2016

(51) Int. Cl.
*H01L 27/12* (2006.01)
*H01L 29/66* (2006.01)

(52) U.S. Cl.
CPC ..... *H01L 27/1211* (2013.01); *H01L 29/66795* (2013.01)

(58) Field of Classification Search
CPC .................................................... H01L 29/785
USPC .......................................... 257/347; 438/283
See application file for complete search history.

(56) References Cited

U.S. PATENT DOCUMENTS

| | | | | |
|---|---|---|---|---|
| 7,374,986 B2* | 5/2008 | Kim | ................. | H01L 29/42392 257/210 |
| 7,898,041 B2* | 3/2011 | Radosavljevic | .. | H01L 29/41791 257/213 |
| 8,816,428 B1* | 8/2014 | Miller | ................. | H01L 21/762 257/329 |
| 9,171,922 B1* | 10/2015 | Zang | ................. | H01L 29/42392 |
| 2006/0076625 A1* | 4/2006 | Lee | ................. | H01L 29/7851 257/353 |
| 2007/0020827 A1* | 1/2007 | Buh | ................. | H01L 29/42392 438/157 |

* cited by examiner

*Primary Examiner* — David Vu
*Assistant Examiner* — Brandon Fox
(74) *Attorney, Agent, or Firm* — Heslin Rothenberg Farley and Mesiti PC; Nicholas Mesiti (57) ABSTRACT

For fabrication of a semiconductor structure, there is set forth herein a method of fabricating a semiconductor structure, the method including forming a multilayer structure, the multilayer structure having a bulk substrate, a first layer defining an ultrathin body spaced apart from the bulk substrate, and a second layer above the first layer having material for defining a fin, and patterning the second layer to define a fin above the ultrathin body.

15 Claims, 12 Drawing Sheets

ULTRATHIN BODY (UTB) FINFET SEMICONDUCTOR STRUCTURE

TECHNICAL FIELD

The present invention relates to semiconductor structure, and more particular a semiconductor structure having an ultrathin body (UTB) and a fin.

BACKGROUND

Different semiconductor structures may be fabricated to have one or more different device characteristics, such as switching speed, leakage power consumption, etc. Multiple different designs may each provide optimization of one or more of these characteristics for devices intended to perform specific functions. For instance, one design may increase switching speed for devices providing computational logic functions, and another design may decrease power consumption for devices providing memory storage functions. A system using multiple discrete devices optimized for different functions presents challenges in terms of system complexity, system footprint and cost.

A semiconductor structure can be provided by a discrete device, e.g., a field effect transistor (FET), a diode, and resistor. A semiconductor structure can be provided by a structure, e.g., a wafer, a die, an integrated circuit having one or a plurality of discrete semiconductor devices.

Optimization challenges are pronounced with continued miniaturization of semiconductor devices. A FET short channel effect can occur when a channel length is reduced to a length on an order of magnitude of a source and drain depletion region dimension. With short channel effects present, FET performance can be rendered more difficult to control.

Various FET architectures have been proposed for addressing the short channel effect. In ultra thin body (UTB) architecture, a FET is formed on an ultrathin layer (e.g., 2 nm-20 nm) of silicon. In a FinFET architecture, a bulk silicon substrate can be recessed to define fins on which source and drain depletion regions can be defined.

BRIEF DESCRIPTION

There is set forth herein a method of fabricating a semiconductor structure, the method including forming a multilayer structure, the multilayer structure having a bulk substrate, a first layer defining an ultrathin body spaced apart from the bulk substrate, and a second layer above the first layer having material for defining a fin, and patterning the second layer to define a fin above the ultrathin body. There is set forth herein a semiconductor structure including a bulk substrate, an ultrathin body above the bulk substrate, and a fin above the ultrathin body separated from the ultrathin body.

BRIEF DESCRIPTION OF THE SEVERAL VIEWS OF THE DRAWINGS

One or more aspects as set forth herein are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

In one aspect there is set forth herein a semiconductor structure having fins and an ultrathin body (UTB). A multilayer structure can be used to pattern fins and an ultrathin body. In one embodiment, the multilayer structure can include a bulk layer, e.g., a bulk silicon layer.

Figure 1:
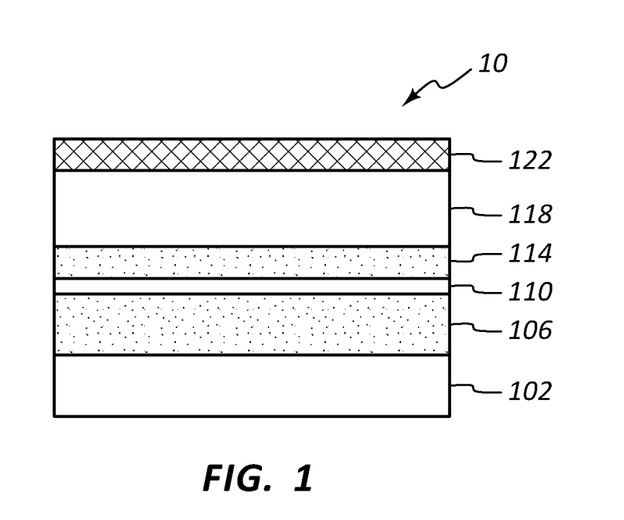
FIG. 1 is a cross sectional side view of a semiconductor structure in an intermediary stage of fabrication.

FIG. 1 illustrates a multilayer semiconductor structure 10 having a substrate 102. Deposited on substrate 102 can be layer 106, layer 110, layer 114, layer 118 and layer 122. In one embodiment, layer 102 can be formed of silicon (Si), layer 106 can be formed of silicon germanium (SiGe), layer 110 can be formed of silicon (Si), layer 114 can be formed of silicon germanium (SiGe), layer 118 can be formed of silicon (Si), and layer 122 can be formed of silicon mononitride (SiN). As will be set forth herein, layer 110 can define an ultrathin body (UTB) layer of a semiconductor structure 10. Layer 110 which can define an ultra thin body (UTB) in one embodiment can have a thickness about 3 nm to about 20 nm. In one embodiment, layer 110 can have a thickness of between about 2 nm and about 15 nm. In one embodiment, layer 110 can have a thickness of less than about 10 nm. In one embodiment, layer 110 can have a thickness of less than about 5 nm. In one embodiment, layer 110 can have a thickness of less than about 4 nm. In one embodiment, layer 110 can have a thickness of less than about 3 nm.

Figure 2:
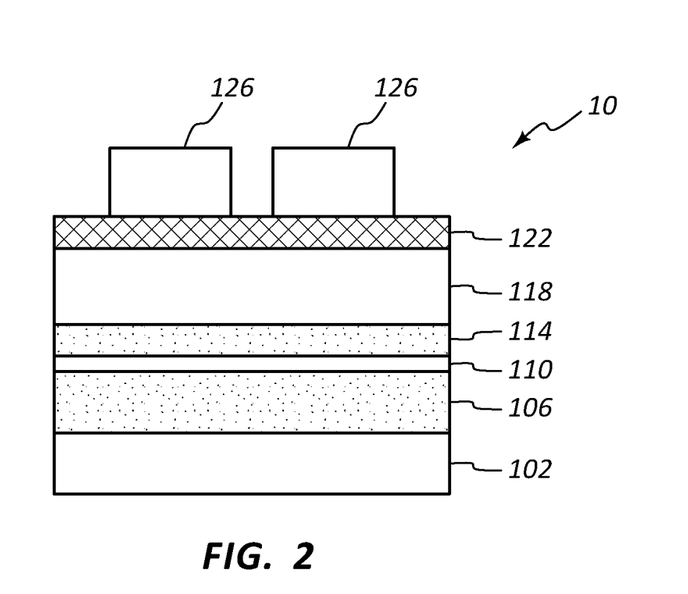
FIG. 2 is a cross sectional side view of a semiconductor structure in an intermediary stage of fabrication, after disposing of a multilayer structure on a wafer.

Referring to FIG. 2, layer 126 can be deposited on layer 122. Layer 126 can be a photoresist layer and have formed using a mask (not shown).

Figure 3:
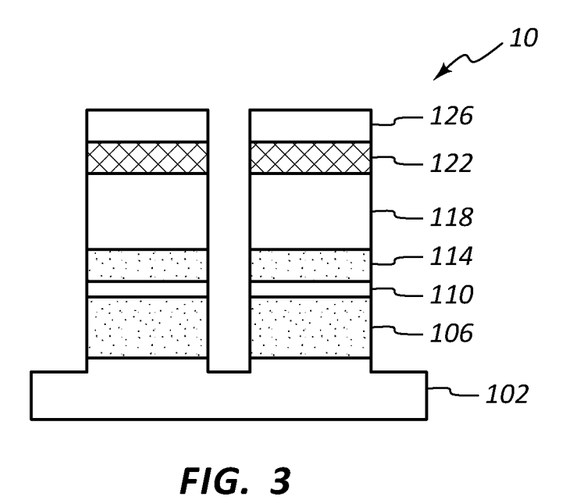
FIG. 3 is a cross sectional side view of a semiconductor structure in an intermediary stage of fabrication, after patterning of a layer to define holes.

FIG. 3 illustrates the semiconductor structure 10 of FIG. 2 after etching for removal of material from layer 122, layer 118, layer 114, layer 110, and layer 106. In addition, a portion of layer 102 can be removed during the etching stage depicted in FIG. 3. In reference to the stage diagram of FIG. 3, it can be seen that layer 126 can function as an etch mask.

Figure 4:
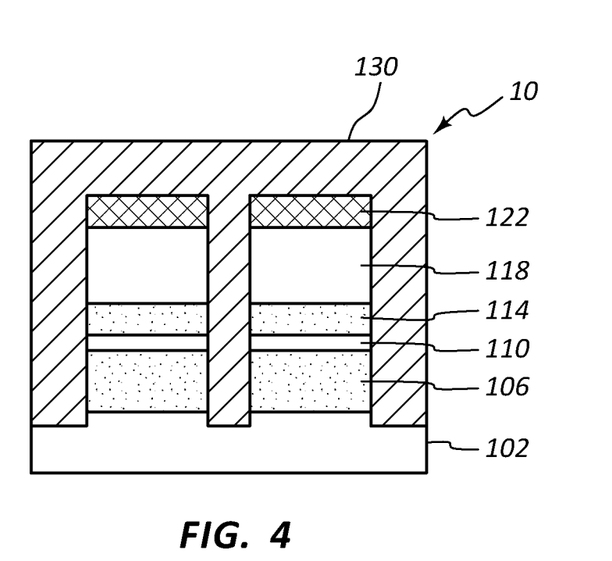
FIG. 4 is a cross sectional side view of a semiconductor structure in an intermediary stage of fabrication after formation of an oxide layer.

Referring to FIG. 4, layer 130 can be deposited over the semiconductor structure 10 as depicted in FIG. 3. Layer 130 can be formed of flowable oxide (FOX).

Figure 5:
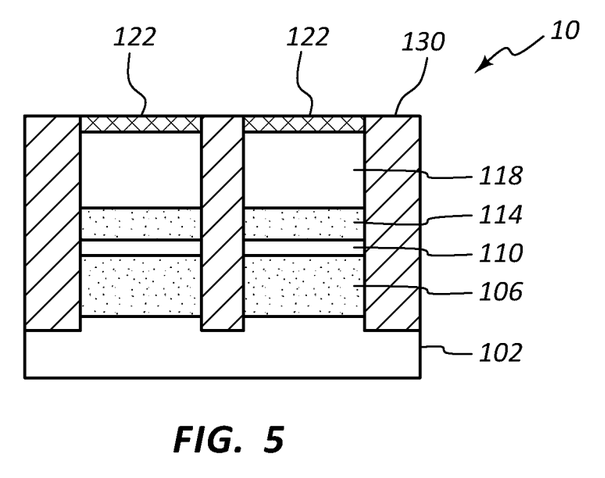
FIG. 5 is a cross sectional side view of a semiconductor structure in an intermediary stage of fabrication, after removal of a portion of a layer using chemical mechanical planarization.

Referring to FIG. 5, FIG. 5 illustrates semiconductor structure 10 of FIG. 4 after a planarization stage. Planarization can be carried out so that planarization stops on layer 122 which can function as an etch stop layer. A portion of layer 122 and layer 130 can be removed during performance of a planarization stage as depicted in FIG. 5. As depicted in FIG. 5, layer 122 can define a planar surface with layer 130. Planarization can be carried out using chemical mechanical planarization (CMP).

Figure 6:
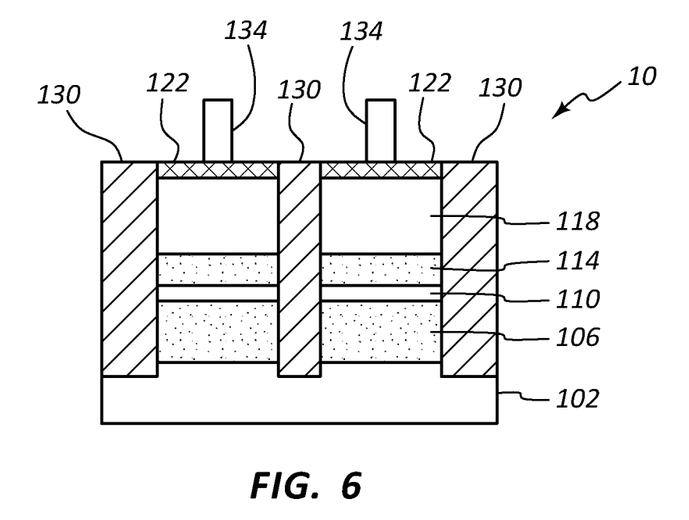
FIG. 6 is a cross sectional side view of a semiconductor structure in an intermediary stage of fabrication after formation of a layer for use in patterning fins, wherein the layer for use in patterning fins is formed using sidewall image transfer (SIT) processes.

Referring to FIG. 6, layer 134 can be formed on layer 122. Layer 134 can be a mask layer. In one embodiment sections of layer 134 may be required to be of narrow width, e.g., less than 10 nm. In one embodiment sidewall image transfer (SIT) methods can be utilized for the formation of layer 134 having laterally spaced sidewall segments as depicted in FIG. 6. Layer 134 can function as an etch mask in the succeeding method stage depicted in FIG. 7.

Figure 7:
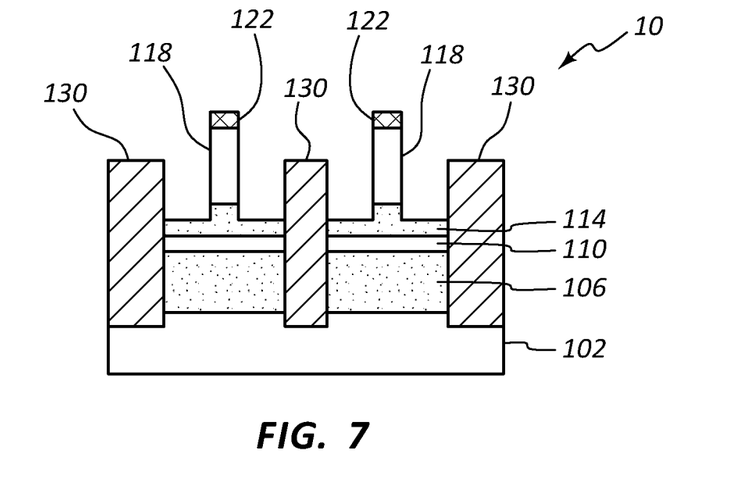
FIG. 7 is a fin widthwise cross sectional side view a semiconductor structure in an intermediary stage of fabrication after etching of a material layer to define fins.

FIG. 7 illustrates the semiconductor structure 10 as depicted in FIG. 6 after performing of etching of material from plurality of layers using layer 134 (FIG. 6) as a mask. With the etching depicted in FIG. 7, portions of layer 130, layer 118 and layer 114 can be removed.

Figure 8:
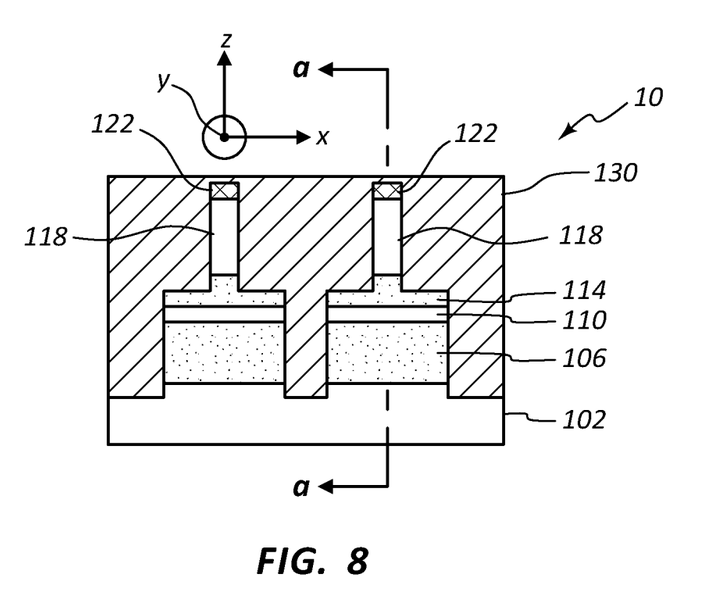
FIG. 8 is a fin widthwise cross sectional side view of a semiconductor structure in an intermediary stage of fabrication, after formation of a layer over the semiconductor structure of FIG. 7.

Referring to FIG. 8, FIG. 8 illustrates the semiconductor structure 10 as depicted in FIG. 7 after deposition of layer 138 and subsequent planarization of layer 138. Layer 138 can be formed of a flowable oxide (FOX).

Figure 9:
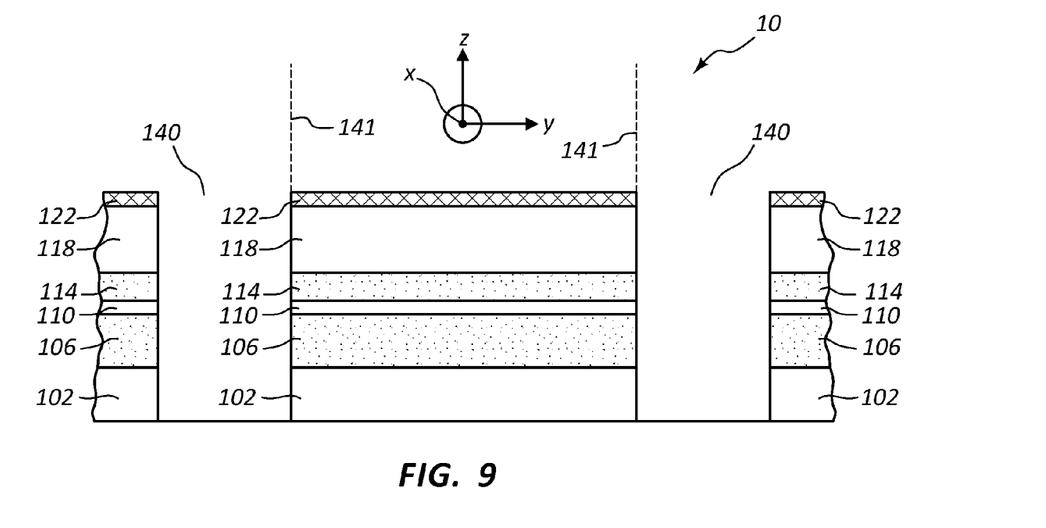
FIG. 9 is a fin lengthwise cross sectional side view of a semiconductor structure in an intermediary stage of fabrication taken along line a-a of FIG. 8 after formation of trenches for use in defining pillars for support of a fin.

Referring to FIG. 8, FIG. 8 is a fin widthwise view of semiconductor structure 10. A fin lengthwise view of the semiconductor structure 10 of FIG. 8 after formation of trenches 140 is shown is FIG. 9. The view of FIG. 9 represents the view of FIG. 8 rotated 90 degrees after formation of trenches 140. Referring to a further fabrication stage as set forth in FIG. 9, trenches 140 can be formed in semiconductor structure 10 using appropriate lithography processes. For the formation of trenches 140, portions of layer 122, layer 130, layer 114, layer 110, layer 106 and layer 102 can be removed.

Figure 10:
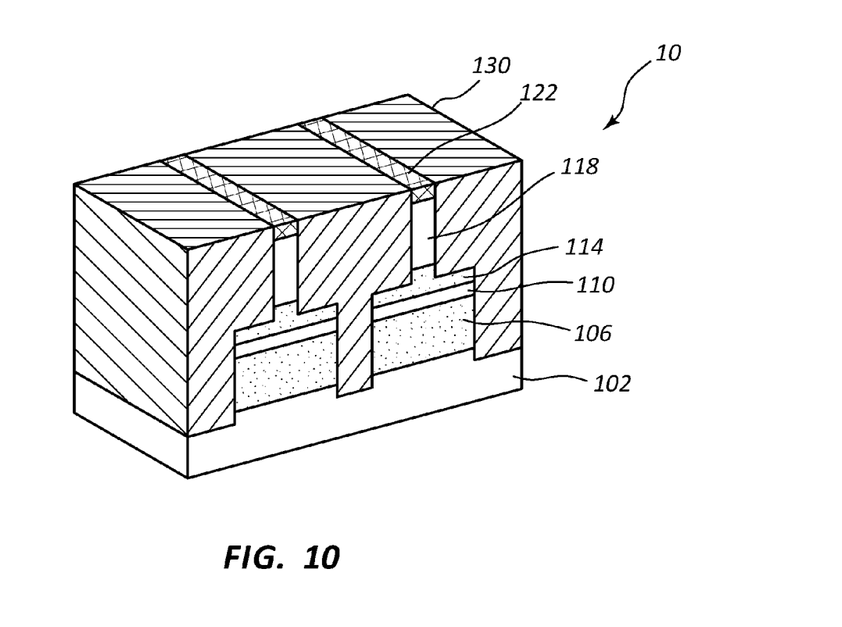
FIG. 10 is a fin widthwise perspective view of the semiconductor structure of FIG. 9 in an intermediary stage of fabrication.

Referring to FIG. 10, FIG. 10 illustrates a perspective view of a portion of the semiconductor structure 10 of FIG. 9. Referring to FIG. 10, trench 140 depicted in FIG. 9 is present in the foreground of the semiconductor structure 10 as depicted in FIG. 9 (forwardly of X-Z vertical boundary plane 141 depicted in FIG. 9.)

Figure 11:
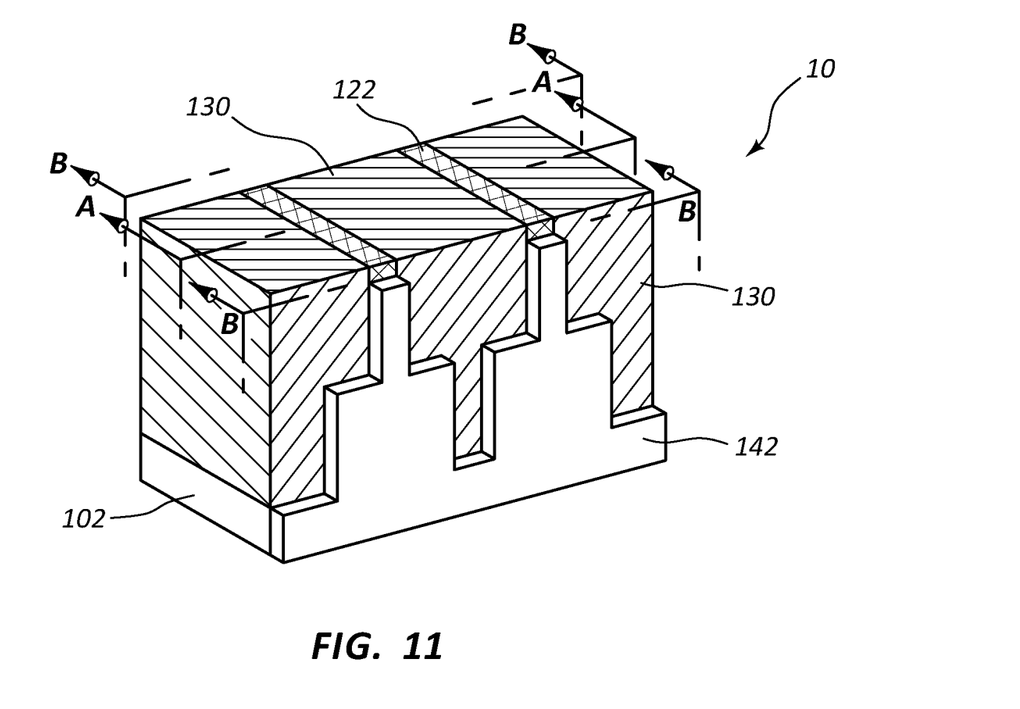
FIG. 11 is a fin widthwise perspective view of the semiconductor structure of FIG. 10 in an intermediary stage of fabrication after formation of a layer for defining a pillar.

Referring to FIG. 11, FIG. 11 illustrates the semiconductor structure 10 as illustrated in FIG. 10 after performance of epitaxial growth processes to form layer 142. Layer 142 can be formed of Si in one embodiment. Layer 142 can be formed forwardly of layers 102, 106, 110, 114, and 118 (which can be formed e.g. of Si or SiGe) depicted in FIG. 10. Layer 142 can be formed within trenches 140 depicted in FIG. 9. Layer 142 may or may not extend an entire width of trench 140 depicted in FIG. 9. Layer 142 can be formed in the foreground of the semiconductor structure 10 as depicted in perspective view as shown in FIG. 10.

Figure 12:
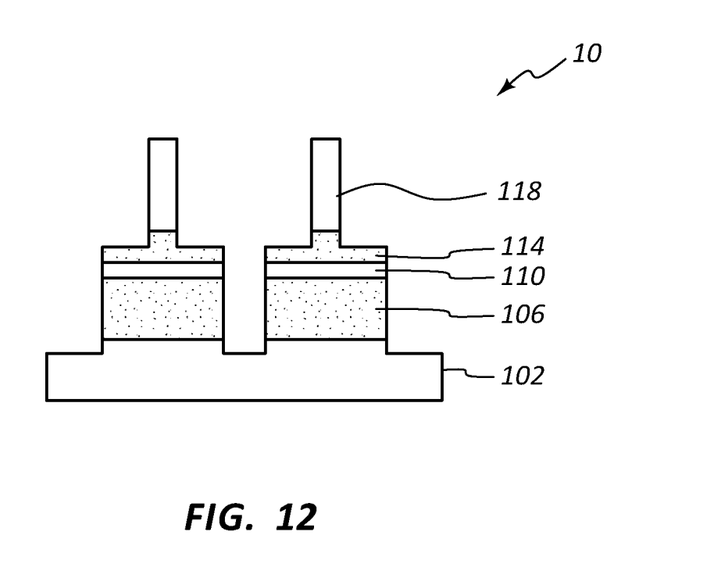
FIG. 12 is a fin widthwise cross sectional side view of a semiconductor structure in an intermediary stage of fabrication taken along line A-A of FIG. 11 after removal of an oxide layer and a hard mask layer from the semiconductor structure.
Figure 13:
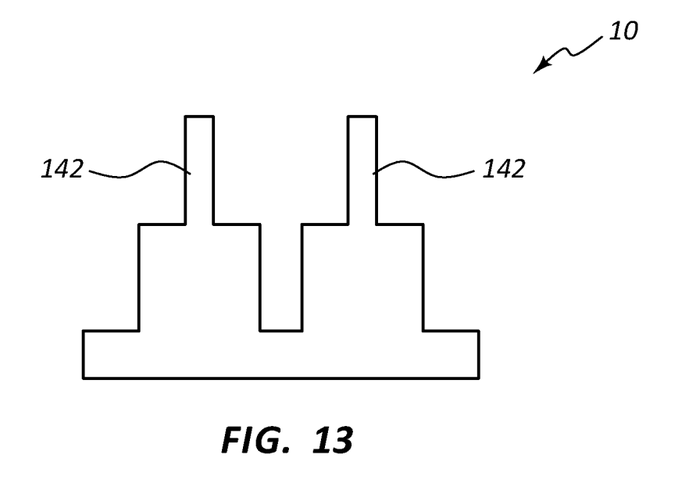
FIG. 13 is a fin widthwise cross sectional side view of a semiconductor structure in an intermediary stage fabrication taken along lines B-B of FIG. 11.

Referring to FIG. 12, FIG. 12 is a fin widthwise cross sectional side view of semiconductor structure 10 as shown in FIG. 11 taken along line A-A of FIG. 11 (center region view) after removal of layer 130 which can be formed of oxide and layer 122 which can be formed of hard mask material. FIG. 13 is a fin widthwise cross sectional view of the semiconductor structure 10 as shown in FIG. 11 taken along lines B-B as shown in FIG. 11 (edge view) after removal of layer 130 which can be formed of oxide and layer 122 which can be formed of hard mask material. After the stage depicted in FIG. 11, layer 130 can be removed. Referring to FIG. 12, it will be seen that along a center cross section A-A (FIG. 11) semiconductor structure 10 defines a multilayer structure. Along the edge cross sections B-B (FIG. 11) semiconductor structure 10 can define a single layer structure as depicted in FIG. 13. It will be seen from a description of succeeding stages that layer 142 can define a support pillar of a fabricated semiconductor structure 10. FIG. 13 illustrates that along edges depicted in FIG. 11, semiconductor structure 10 can include a single layer structure, e.g., a single layer structure including layer 142 which can be an Si layer.

Referring further to FIGS. 9-13, layers 106 and 114 in an area between X-Z vertical boundary planes 141 depicted in FIG. 9 can be subject to removal. Layers 106 and 114 can be removed using, e.g., an SiGe wet etching process.

Figure 14:
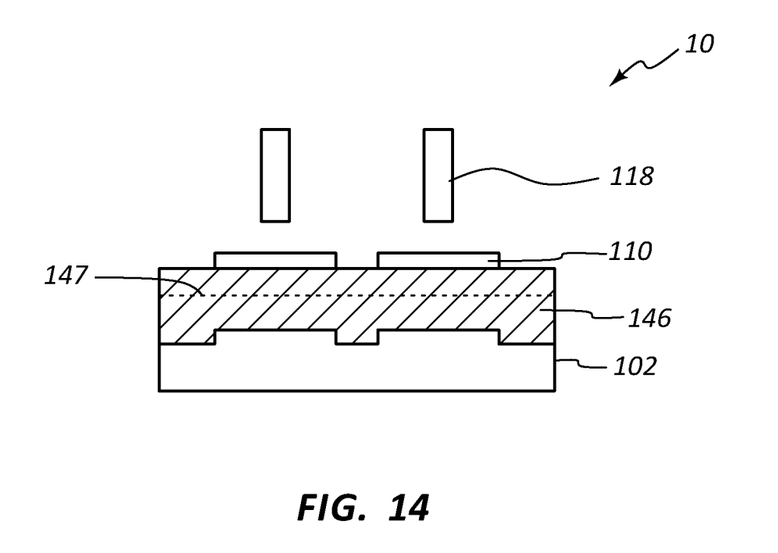
FIG. 14 is a fin widthwise cross sectional side view of a semiconductor structure in an intermediary stage of fabrication taken along line A-A of FIG. 11 after removal of a layer and addition of a layer above a bulk substrate.

Referring to FIG. 14, FIG. 14 is a fin widthwise cross sectional side view of semiconductor structure 10 depicted in FIG. 12 taken along line A-A of FIG. 11 after removal of layer 106 and layer 118 and after formation of layer 146.

Further referring to FIG. 14, layer 146 in one embodiment can be formed on layer 102. Layer 146 can be formed of flowable oxide (FOX). Layer 146 can be initially overfilled to an elevation above a top elevation of layer 118 and then can be recessed.

Figure 15:
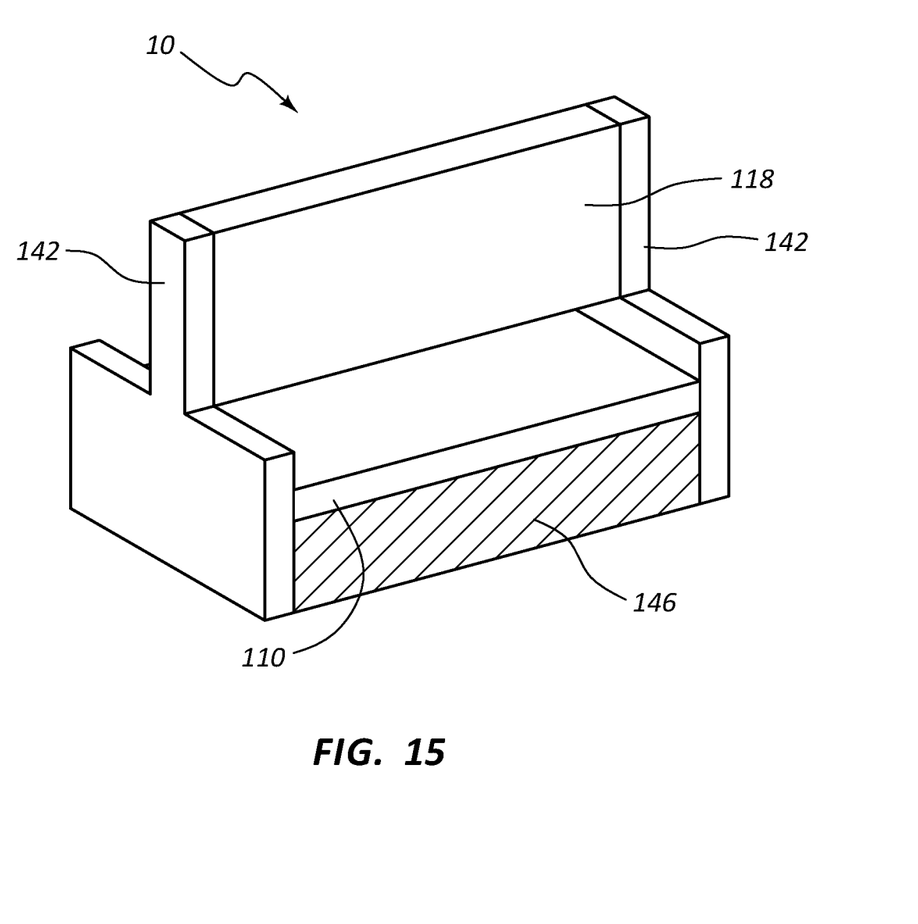
FIG. 15 is a fin lengthwise perspective view of the semiconductor structure as shown in FIG. 14 in an intermediary stage of fabrication.

Referring to FIG. 15, FIG. 15 is a perspective view of semiconductor structure 10 as shown in the fin widthwise view of FIG. 14. Referring to FIG. 15, layer 118 defines a fin, layer 142 defines a pillar, and layer 110 defines a UTB in the semiconductor structure 10 depicted in FIG. 15. The fin defined by layer 118 can be separated from the UTB defined by layer 110.

Figures 16, 17:
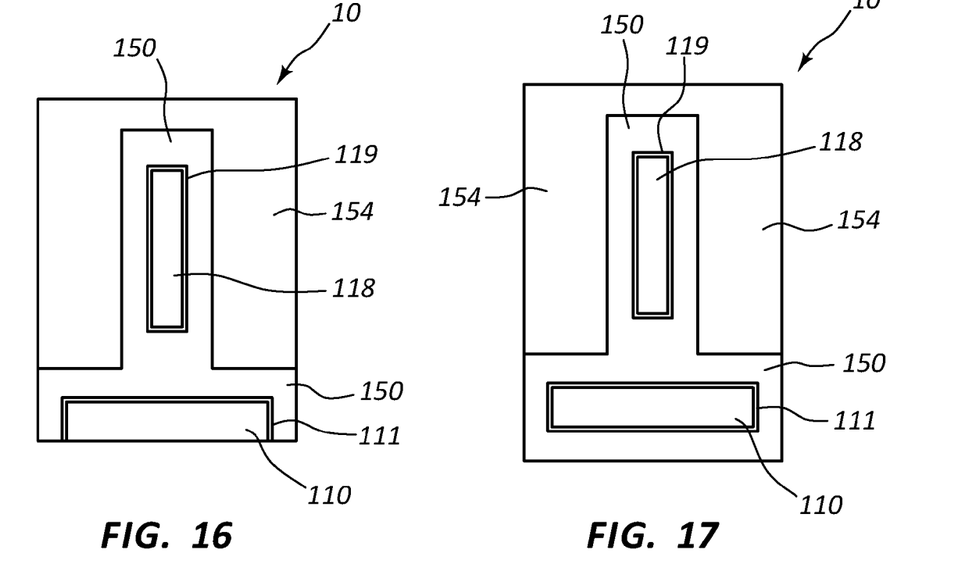
FIG. 16 is a fin widthwise cross sectional side view illustrating formation of a gate about a fin and an ultrathin body.
FIG. 17 is a fin widthwise cross sectional side view illustrating formation of a gate about a fin and an ultrathin body wherein the gate is wrapped 360 degrees around the fin and the ultrathin body.

Referring to FIG. 16, FIG. 16 illustrates formation of a gate structure using a semiconductor structure 10 as depicted in FIGS. 14 and 15. For formation of a field effect transistor (FET) gate, layer 150 formed of work function metal can be formed about the fin defined by layer 118 and the UTB defined by layer 110. A layer 119 formed of dielectric material, e.g., a high K dielectric material can be formed between layer 118 and layer 150 formed of work function metal. A layer 111 formed of dielectric material, e.g., a high K dielectric material can be formed between layer 110 and layer 150 formed of work function metal. Work function metal forming layer 150 can be provided by, e.g., TiN, TiCAl, or TaN. A conductive metal, e.g., Tungsten (W) can then be formed about layer 150.

Referring to FIG. 17, FIG. 17 illustrates formation of a field effect transistor (FET) gate using a semiconductor structure 10 as depicted in FIGS. 14 and 15 modified by limiting an elevation of layer 146 (which can include flowable oxide) to elevation 147. By limiting an elevation of layer 146 to elevation 147, a gap can be defined between layer 146 and layer 110. Referring to FIG. 17, layer 150 which can be a work function layer can be formed to wrap around layer 110 defining a UTB. Layer 150 can wrap 360 degrees around layer 118 defining a fin. Layer 154 which can include a conductive metal can be formed about layer 150.

Figure 18:
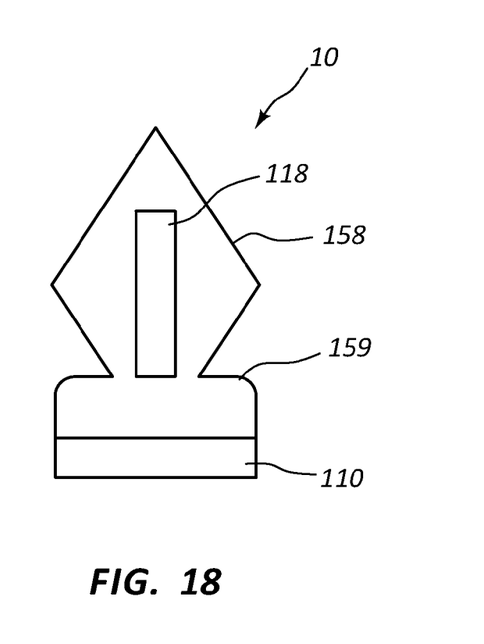
FIG. 18 is a fin widthwise cross sectional side view illustrating formation of a source drain region having an epitaxial growth region that is grown on a pillar.

Referring to FIG. 18, FIG. 18 illustrates formation of a source/drain region with a semiconductor structure 10 as depicted in FIGS. 14 and 15. Referring to FIG. 18, there is illustrated is an epitaxial growth formation 158 and epitaxial growth formation 159. Epitaxial growth formation 158 with a doped portion of layer 118 can define a source/drain region. Epitaxial growth formation 159 with a doped portion of layer 110 can define a source/drain region. Epitaxial growth formation 158 and epitaxial growth formation 159 can be merged as shown in FIGS. 16 and 17. A pair of source/drain regions together with a gate (FIGS. 16 and 17) can define a field effect transistor (FET).

Figure 19:
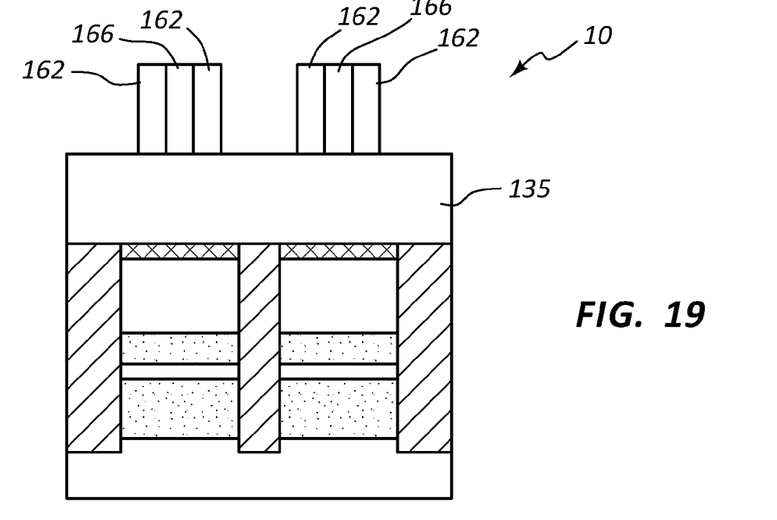
FIGS. 19 and 20 are cross sectional side views of a semiconductor structure in intermediary stages of fabrication for use in patterning fins of increased density.
Figure 20:
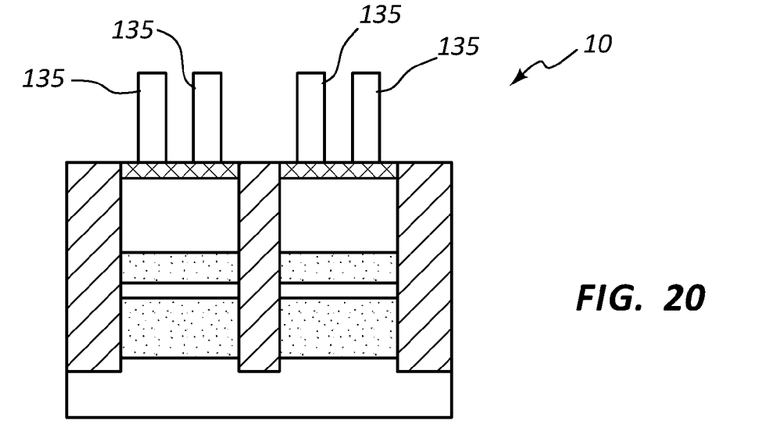

Referring to FIG. 19 and FIG. 20, FIG. 19 and FIG. 20 are ultrathin body (UTB) semiconductor structures 10 in intermediary stages of fabrication fabricated so that fins can be formed with a higher density than in the embodiment depicted in FIGS. 14-18.

Referring to FIG. 20, FIG. 20 illustrates the intermediary fabrication stage semiconductor structure 10 of FIG. 6 except the layer 135 of FIG. 20 having a plurality of sidewall segments is patterned to include a higher density than the sidewall segments of layer 134 depicted in the embodiment of FIG. 6. The higher density of sidewall segments can be achieved using sidewall image transfer (SIT) methods as are depicted in FIG. 19. Referring to FIG. 19, layer 135 can be formed, and image transfer layer 162 and layer 166 can be formed above layer 135.

Figure 21:
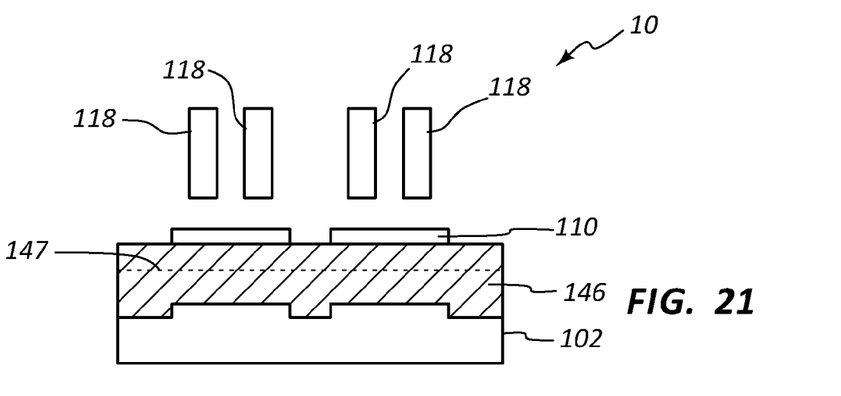
FIG. 21 is a cross sectional side view of a semiconductor structure in an intermediary stage of fabrication wherein the semiconductor structure is patterned for increased fin density.

Referring to FIG. 21, FIG. 21 illustrates a semiconductor structure 10 in an intermediary stage of fabrication corresponding to the stage depicted in FIG. 14 except fabricated to include an increased density of fins using the modified (SIT) method depicted in FIGS. 19-20.

Figure 22:
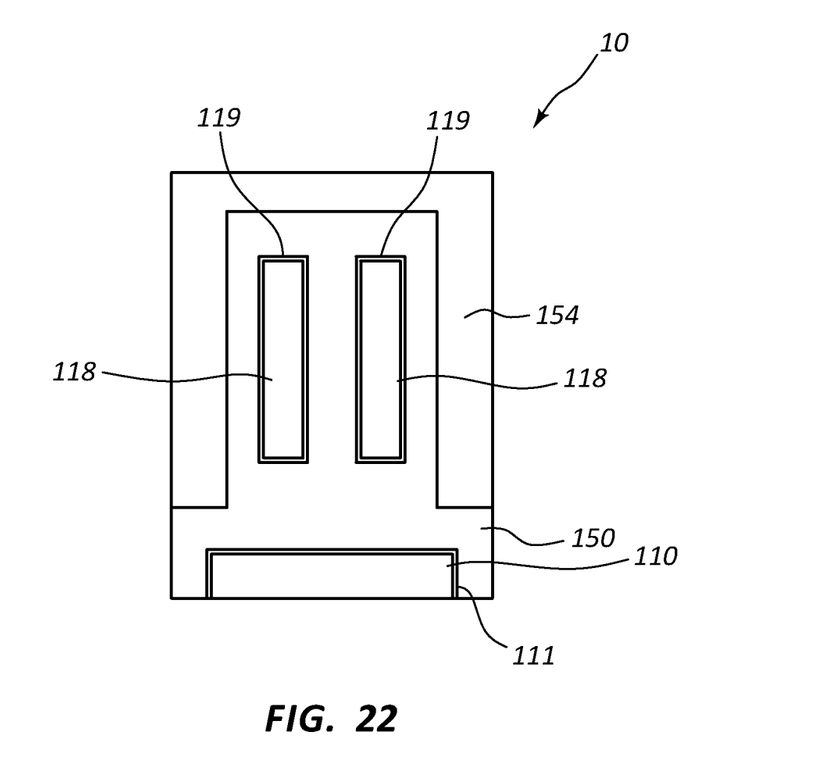
FIG. 22 is a cross sectional fin widthwise side view illustrating formation of a gate about first and second fins and an ultrathin body.

Referring to FIG. 22, FIG. 22 illustrates gate formation in accordance with the intermediary stage fabrication view of FIG. 16 except that density of fins defined by layer 118 is increased using the modified (SIT) method depicted in FIGS. 19-20.

Figure 23:
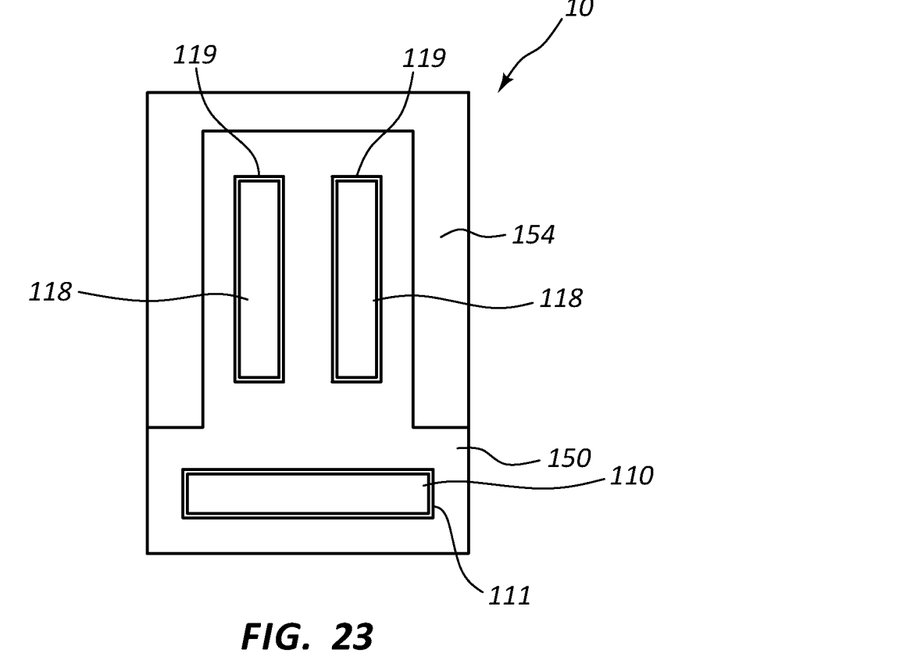
FIG. 23 is a cross sectional fin widthwise side view illustrating formation of a gate about a fin and an ultrathin body wherein the gate is wrapped 360 degrees around each of first and second fin and the ultrathin body.

Referring to FIG. 23, FIG. 23 illustrates gate formation in accordance with the intermediary stage fabrication view of FIG. 17 except that density of fins defined by layer 118 is increased using the modified (SIT) method depicted in FIGS. 19-20.

Figure 24:
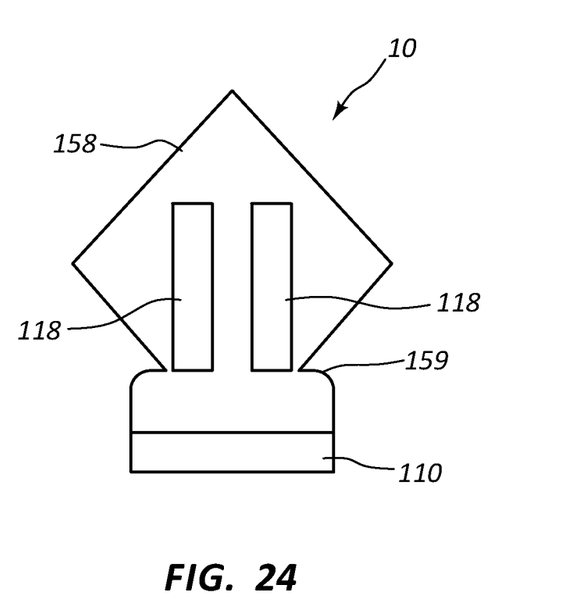
FIG. 24 is a cross sectional fin widthwise side view illustrating formation of a source drain region having an epitaxial growth region that is grown on a pillar.

Referring to FIG. 24, FIG. 24 illustrates formation of a source/drain region with a semiconductor structure 10 having increased density of fins using the modified SIT method depicted in FIGS. 19-20. Referring to FIG. 24, there is illustrated an epitaxial growth formation 158 and epitaxial growth formation 159. Epitaxial growth formation 158 with a doped portion of layer 118 can define one or more source/drain region. Epitaxial growth formation 159 with a doped portion of layer 110 can define a source/drain region. A pair of source/drain regions together with a gate (FIGS. 22 and 23) can define a field effect transistor (FET).

There is set forth herein in reference to FIGS. 1-24 a method of fabricating a semiconductor structure, the method including forming a multilayer structure, the multilayer structure having a bulk substrate 102, a first layer 110 defining an ultrathin body spaced apart from the bulk substrate 102, and a second layer 118 above the first layer having material for defining a fin, and patterning the second layer 118 to define a fin above the ultrathin body. There is also set forth herein with reference, e.g., to FIG. 6 and FIG. 20 a method wherein patterning includes using sidewall image transfer to pattern fins above the ultrathin body.

There is set forth herein in reference to FIGS. 14-15 and 21 a semiconductor structure 10 having a bulk substrate 102, an ultrathin body (defined by layer 110) above the bulk substrate, and a fin (defined by layer 118) above the ultrathin body (defined by layer 110) separated from the ultrathin body (defined by layer 110). As shown, e.g., in FIG. 15 the fin (defined by layer 118) can be supported on the ultrathin body (defined by layer 110) by spaced pillars (defined by layer 142) extending upwardly from the ultrathin body (defined by layer 110). In one embodiment, as shown in FIGS. 17 and 23 work function metal (forming layer 150) can be wrapped 360 degrees around the ultrathin body (defined by layer 110). In one embodiment, as shown in FIGS. 16-17 and 22-23 work function metal (forming layer 150) can be wrapped 360 degrees around a fin (defined by layer 118).

Each of the deposited layers as set forth herein, e.g., layer 106, layer 110, layer 114, layer 118, layer 122, layer 126, layer 130, layer 134, layer 142, layer 146, layer 150, layer 154, layer 135, layer 162, and layer 164, can be deposited using any of a variety of deposition processes, including, for example, physical vapor deposition (PVD), atomic layer deposition (ALD), chemical vapor deposition (CVD), sputtering, or other known processes, depending on the material composition of the layer.

In one example, protective mask layers as set forth herein, e.g., a mask layers for patterning layer 126 and layer 134 and layer 135 and layer 162 and layer 164 as set forth herein may include a material such as, for example, silicon nitride, silicon oxide, or silicon oxynitride, and may be deposited using conventional deposition processes, such as, for example, CVD or plasma-enhanced CVD (PECVD). In other examples, other mask materials may be used depending upon the materials used in semiconductor structure. For instance, a protective mask layer may be or include an organic material. For instance, flowable oxide such as, for example, a hydrogen silsesquioxane polymer, or a carbon-free silsesquioxane polymer, may be deposited by flowable chemical vapor deposition (F-CVD). In another example, a protective mask layer may be or include an organic polymer, for example, polyacrylate resin, epoxy resin, phenol resin, polyamide resin, polyimide resin, unsaturated polyester resin, polyphenylene ether resin, polyphenylenesulfide resin or benzocyclobutene (BCB).

Removing material of a layer as set forth herein, e.g., layer 126, layer 122, layer 118, layer 114, layer 110, layer 106, layer 130, layer 134, layer 135, layer 162, or layer 164 can be achieved by any suitable etching process, such as dry or wet etching processing. In one example, isotropic dry etching may be used by, for example, ion beam etching, plasma etching or isotropic RIE. In another example, isotropic wet etching may also be performed using etching solutions selective to the material subject to removal.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of fabricating a semiconductor structure, the method comprising:
   forming a multilayer structure, the multilayer structure having a bulk substrate, a first layer defining an ultrathin body spaced apart from the bulk substrate, and a second layer above the first layer having material for defining a fin; and
   patterning the second layer to define a fin above the ultrathin body; and
   forming trenches at edges of the defined fin, and forming material in the trenches that defines pillars that support the fin.

2. The method of claim 1, wherein the patterning includes using a sidewall image transfer process to pattern fins above the ultrathin body.

3. The method of claim 1, wherein the multilayer structure includes a first material between the first layer and the bulk substrate and wherein the method includes removing the first material and replacing the first material with an oxide.

4. The method of claim 1, wherein the multilayer structure includes a second material between the first layer and the second layer, and wherein the method includes removing the second material.

5. The method of claim 1, wherein the method includes forming a gate about the defined fin and about the ultrathin body.

6. The method of claim 1, wherein the bulk substrate is a bulk silicon substrate.

7. The method of claim 1, wherein the first layer has a thickness of less than 5 nm.

8. A semiconductor structure comprising:
   a multilayer structure having a bulk substrate;
   an ultrathin body having a first layer above the bulk substrate;
   a fin above the ultrathin body having a first layer and separated from the ultrathin body; and
   trenches formed at edges of the fin with material in the trenches that defines pillars that support the fin.

9. The semiconductor structure of claim 8, wherein the bulk substrate, the ultrathin body and the fin are formed of silicon.

10. The semiconductor structure of claim 8, wherein work function metal is wrapped 360 degrees around the ultrathin body.

11. The semiconductor structure of claim 8, wherein work function metal is wrapped 360 degrees around the fin.

12. The semiconductor structure of claim 8, wherein work function metal is wrapped 360 degrees around the ultrathin body, and wherein work function metal is wrapped 360 degrees around the fin.

13. The semiconductor structure of claim 12, wherein dielectric material is formed between the work function metal and the ultrathin body, and wherein dielectric material is formed between the work function metal and the fin.

14. The semiconductor structure of claim 13, wherein the first layer has a thickness of less than 5 nm.

15. The semiconductor structure of claim 8, wherein the first layer has a thickness of less than 10 nm.

* * * * *